US007952262B2

(12) United States Patent
Wilcox et al.

(10) Patent No.: US 7,952,262 B2
(45) Date of Patent: May 31, 2011

(54) MODULAR LED UNIT INCORPORATING INTERCONNECTED HEAT SINKS CONFIGURED TO MOUNT AND HOLD ADJACENT LED MODULES

(75) Inventors: Kurt Wilcox, Libertyville, IL (US); Steven R. Walczak, Hales Corners, WI (US); Steven J. Patkus, Sturtevant, WI (US); Alan J. Ruud, Racine, WI (US)

(73) Assignee: Ruud Lighting, Inc., Racine, WI (US)

( * ) Notice: Subject to any disclaimer, the term of this patent is extended or adjusted under 35 U.S.C. 154(b) by 729 days.

(21) Appl. No.: 11/860,843

(22) Filed: Sep. 25, 2007

(65) Prior Publication Data

US 2008/0078524 A1 Apr. 3, 2008

Related U.S. Application Data

(63) Continuation-in-part of application No. 11/541,905, filed on Sep. 30, 2006, now abandoned.

(51) Int. Cl.
*F21V 29/00* (2006.01)
*F21V 21/00* (2006.01)
*H01L 33/64* (2010.01)

(52) U.S. Cl. ............ 313/46; 313/45; 362/294; 362/545; 362/249.02; 362/555; 362/800

(58) Field of Classification Search .................. 362/241, 362/555, 800, 294, 545, 249.02; 313/498–512, 313/42–57; 257/98–100
See application file for complete search history.

(56) References Cited

U.S. PATENT DOCUMENTS

| | | | |
|---|---|---|---|
| 2,772,382 | A | 11/1956 | Escoffery |
| 3,800,177 | A | 3/1974 | Russ |
| 3,819,929 | A | 6/1974 | Newman |
| 3,889,147 | A | 6/1975 | Groves |
| D246,203 | S | 10/1977 | Harris |
| 4,187,711 | A | 2/1980 | Lavochkin et al. |
| 4,203,488 | A | 5/1980 | Johnson et al. |
| 4,235,285 | A | 11/1980 | Johnson et al. |
| D266,080 | S | 9/1982 | Assanuma |
| D266,081 | S | 9/1982 | Assanuma |

(Continued)

FOREIGN PATENT DOCUMENTS

DE 101 10 835 3/2001

(Continued)

OTHER PUBLICATIONS

Future Lighting Solutions brochure. "The 6 Steps to LED Lighting Success". 6 pages. Date: undated.

(Continued)

*Primary Examiner* — Mariceli Santiago
(74) *Attorney, Agent, or Firm* — Jansson Shupe & Munger Ltd.

(57) ABSTRACT

A modular LED unit having a number of LED modules separately mounted on individual interconnected preferably-extruded heat sinks, each heat sink having: a base configured to engage and hold an LED module in place and, in preferred forms, to facilitate the ganging of heat-sink/LED modules; and a plurality of fins, including inner-fins and side-fins, projecting from the opposite surface of the base and extending therealong, the side-fins having interlocking features to facilitate the ganging of heat-sink/module units together and, in preferred forms, to facilitate interconnection of the modular LED unit to other portions of a lighting fixture.

12 Claims, 6 Drawing Sheets

U.S. PATENT DOCUMENTS

| | | | | |
|---|---|---|---|---|
| D266,082 | S | 9/1982 | Assanuma | |
| D275,749 | S | 10/1984 | McCarthy | |
| 4,508,163 | A | 4/1985 | McCarthy | |
| 4,552,206 | A | 11/1985 | Johnson et al. | |
| D285,194 | S | 8/1986 | McCarthy | |
| 4,679,118 | A | 7/1987 | Johnson et al. | |
| 4,729,076 | A | 3/1988 | Masami et al. | |
| D296,778 | S | 7/1988 | McCarthy | |
| 4,875,057 | A | 10/1989 | Hedliger et al. | |
| 4,899,210 | A | 2/1990 | Lorenzetti et al. | |
| 5,119,174 | A | 6/1992 | Chen | |
| 5,172,755 | A | 12/1992 | Samarov | |
| 5,226,723 | A | 7/1993 | Chen | |
| D338,449 | S | 8/1993 | Sahyoun | |
| 5,285,350 | A | 2/1994 | Villaume | |
| 5,304,735 | A | 4/1994 | Earl et al. | |
| 5,381,041 | A | 1/1995 | Harmon | |
| 5,381,305 | A | 1/1995 | Harmon et al. | |
| 5,384,940 | A | 1/1995 | Soule et al. | |
| 5,436,798 | A | 7/1995 | Wieland, Jr. | |
| D361,317 | S | 8/1995 | Harmon et al. | |
| D361,986 | S | 9/1995 | Harmon | |
| 5,494,098 | A | 2/1996 | Morosas | |
| 5,562,146 | A | 10/1996 | Harmon et al. | |
| 5,576,933 | A | 11/1996 | Campanella et al. | |
| D376,349 | S | 12/1996 | Campanella et al. | |
| 5,581,442 | A | 12/1996 | Morosas | |
| 5,611,393 | A | 3/1997 | Vasconcelos et al. | |
| 5,632,551 | A | 5/1997 | Roney et al. | |
| 5,660,461 | A * | 8/1997 | Ignatius et al. | 362/241 |
| D384,040 | S | 9/1997 | Frerichs et al. | |
| D390,539 | S | 2/1998 | Campanella | |
| D394,043 | S | 5/1998 | Campanella et al. | |
| 5,771,155 | A | 6/1998 | Cook | |
| 5,857,767 | A | 1/1999 | Hochstein | |
| D407,381 | S | 3/1999 | Campanella | |
| 5,894,882 | A | 4/1999 | Kikuchi et al. | |
| 5,936,353 | A | 8/1999 | Triner et al. | |
| 6,011,299 | A | 1/2000 | Brench | |
| 6,045,240 | A | 4/2000 | Hochstein | |
| D442,565 | S | 5/2001 | Chou et al. | |
| D442,566 | S | 5/2001 | Chou et al. | |
| 6,229,160 | B1 | 5/2001 | Krames et al. | |
| D445,922 | S | 7/2001 | Yasuoka | |
| 6,255,786 | B1 | 7/2001 | Yen | |
| 6,274,924 | B1 | 8/2001 | Carey et al. | |
| D450,306 | S | 11/2001 | Lin et al. | |
| 6,323,063 | B2 | 11/2001 | Krames et al. | |
| 6,375,340 | B1 | 4/2002 | Biebl et al. | |
| 6,401,806 | B1 | 6/2002 | Lee et al. | |
| 6,428,189 | B1 | 8/2002 | Hochstein | |
| 6,449,151 | B1 | 9/2002 | Chen | |
| 6,457,837 | B1 | 10/2002 | Steffensmeier | |
| D465,462 | S | 11/2002 | Hsieh | |
| 6,481,874 | B2 | 11/2002 | Petroski | |
| 6,486,499 | B1 | 11/2002 | Krames et al. | |
| 6,498,355 | B1 | 12/2002 | Harrah et al. | |
| 6,501,103 | B1 | 12/2002 | Jory et al. | |
| 6,517,218 | B2 | 2/2003 | Hochstein | |
| 6,521,914 | B2 | 2/2003 | Krames et al. | |
| 6,547,249 | B2 | 4/2003 | Collins, III et al. | |
| 6,554,451 | B1 | 4/2003 | Keuper | |
| 6,558,021 | B2 | 5/2003 | Wu et al. | |
| 6,565,238 | B1 | 5/2003 | Pyrtle | |
| 6,570,190 | B2 | 5/2003 | Krames et al. | |
| 6,578,986 | B2 | 6/2003 | Swarls et al. | |
| 6,612,717 | B2 | 9/2003 | Yen | |
| 6,614,103 | B1 | 9/2003 | Durocher et al. | |
| D481,017 | S | 10/2003 | Hsia et al. | |
| 6,641,284 | B2 | 11/2003 | Stopa et al. | |
| 6,666,567 | B1 | 12/2003 | Feldman et al. | |
| 6,688,380 | B2 | 2/2004 | Lavochkin et al. | |
| 6,720,566 | B2 | 4/2004 | Blandford | |
| D493,151 | S | 7/2004 | Lee | |
| D494,549 | S | 8/2004 | Lee | |
| 6,834,981 | B2 | 12/2004 | Nagai et al. | |
| 6,851,831 | B2 | 2/2005 | Karlicek, Jr. | |
| 6,857,767 | B2 | 2/2005 | Matsui et al. | |
| 6,860,620 | B2 | 3/2005 | Kuan et al. | |
| 6,864,513 | B2 | 3/2005 | Lin et al. | |
| 6,885,035 | B2 | 4/2005 | Bhat et al. | |
| 6,914,261 | B2 | 7/2005 | Ho | |
| 6,932,495 | B2 | 8/2005 | Sloan et al. | |
| 6,934,153 | B2 | 8/2005 | Lee et al. | |
| 6,935,410 | B2 | 8/2005 | Lee et al. | |
| 6,999,318 | B2 | 2/2006 | Newby | |
| 7,008,080 | B2 | 3/2006 | Bachl et al. | |
| 7,045,965 | B2 | 5/2006 | Li et al. | |
| 7,055,987 | B2 | 6/2006 | Staufert | |
| 7,081,645 | B2 | 7/2006 | Chen et al. | |
| D526,972 | S | 8/2006 | Egawa et al. | |
| 7,234,844 | B2 | 6/2007 | Bolta et al. | |
| 7,267,459 | B2 | 9/2007 | Matheson | |
| 7,273,987 | B2 | 9/2007 | Becker et al. | |
| 7,278,761 | B2 | 10/2007 | Kuan | |
| 2002/0070386 | A1 | 6/2002 | Krames et al. | |
| 2002/0171087 | A1 | 11/2002 | Krames et al. | |
| 2002/0196623 | A1 | 12/2002 | Yen | |
| 2003/0179548 | A1 | 9/2003 | Becker et al. | |
| 2003/0189829 | A1 | 10/2003 | Shimizu et al. | |
| 2004/0052077 | A1 | 3/2004 | Shih | |
| 2004/0161338 | A1 | 8/2004 | Hsieh | |
| 2004/0174651 | A1 | 9/2004 | Aisenbrey | |
| 2004/0175189 | A1 | 9/2004 | Weber-Rabsilber et al. | |
| 2004/0212291 | A1 | 10/2004 | Keuper | |
| 2004/0213016 | A1 | 10/2004 | Rice | |
| 2004/0222516 | A1 | 11/2004 | Lin et al. | |
| 2004/0257808 | A1 | 12/2004 | Bjornson et al. | |
| 2004/0264195 | A1 | 12/2004 | Chang et al. | |
| 2005/0023545 | A1 | 2/2005 | Camras et al. | |
| 2005/0052378 | A1 | 3/2005 | Hacker | |
| 2005/0057939 | A1 | 3/2005 | Mizuyoshi | |
| 2005/0072558 | A1 | 4/2005 | Whitney et al. | |
| 2005/0135093 | A1 | 6/2005 | Alexanderson et al. | |
| 2005/0190562 | A1 | 9/2005 | Keuper et al. | |
| 2005/0224826 | A1 | 10/2005 | Keuper et al. | |
| 2005/0274959 | A1 | 12/2005 | Kim et al. | |
| 2005/0281033 | A1 | 12/2005 | Coushaine et al. | |
| 2006/0018099 | A1 | 1/2006 | Chen | |
| 2006/0061967 | A1 | 3/2006 | Kim et al. | |
| 2006/0097385 | A1 | 5/2006 | Negley | |
| 2006/0105482 | A1 | 5/2006 | Alferink et al. | |
| 2006/0131757 | A1 | 6/2006 | Yu et al. | |
| 2006/0138645 | A1 | 6/2006 | Ng et al. | |
| 2006/0138951 | A1 | 6/2006 | Tain et al. | |
| 2006/0141851 | A1 | 6/2006 | Matsui et al. | |
| 2006/0181878 | A1 | 8/2006 | Burkholder | |
| 2007/0098334 | A1 | 5/2007 | Chen | |
| 2008/0080189 | A1 | 4/2008 | Wang | |

FOREIGN PATENT DOCUMENTS

| | | | |
|---|---|---|---|
| FR | 2818786 | | 6/2002 |
| GB | 2 201 042 | | 8/1988 |
| JP | 59229844 | A * | 12/1984 |
| JP | 2000183406 | A * | 6/2000 |
| JP | 2005-109228 | | 4/2001 |
| NL | 1026514 | | 6/2004 |
| WO | WO 02/16826 | | 2/2002 |
| WO | WO 03/089841 | | 10/2003 |
| WO | WO2004/079256 | | 9/2004 |
| WO | WO2006/049086 | | 5/2006 |
| WO | WO2007/000037 | | 1/2007 |
| WO | WO 2007/000037 | | 1/2007 |

OTHER PUBLICATIONS

Excerpt from Aavid Thermalloy (www.aavidthermalloy.com). "LED Light Sources". 1 page. Date: Copyright 2006.

Aavid Thermal Technologies, Inc. article. "How to Select a Heat sinck". 5 pages. Date: undated.

Excerpt from Mouser Electronics (www.mouser.com). Product List. 1 page. Date: Aug. 16, 2006.

Excerpt from Lumileds Future Electronics (www.lumiledsfuture.com). "Thermal Solutions". 1 page. Date: Jul. 14, 2006.

Excerpt from National Northeast Corporation brochure. "Miscellaneous Shape Heat Sinks". 2 pages. Date: undated.

Excerpt from Aavid Thermalloy (www.aavidthermalloy.com). Part Specification. 3 pages. Date: Copyright 2006.
Excerpt from Aavid Thermalloy (www.aavidthermalloy.com). Part Specification. 1 page. Date: Copyright 2006.
Excerpt from Therma-Flo brochure. 8 pages. Date: Copyright 2002.
Excerpt from Aavid Thermalloy (www.aavidthermalloy.com). "Product Offerings". 2 pages. Date: Copyright 2006.
Excerpt from ThermaFlo (www.thermaflo.com). "Bonded Fin Heat Sinks". 1 page. Date: Aug. 24, 2006.
Excerpt from ThermaFlo (www.thermaflo.com). "Folded Fin Heat Sinks". 2 pages. Date: Aug. 24, 2006.
Excerpt from ThermaFlo (www.thermaflo.com). "High Power Heat Sinks". 2 pages. Date: Aug. 24, 2006.
National Northwest Corporation brochure. "Flat Back Shape Heat Sinks III". 12 pages. Date: undated.
Excerpt from Wakefield Thermal Solutions (www.wakefield.com). "Thermal Extrusions". 1 page. Date: Aug. 16, 2006.
Wakefield Thermal Solutions brochure. "Quality Aluminum Extrusion and Fabrication". 4 pages. Date: undated.
Stanely Electric co., Ltd. "Stanley LED for Street Light Brochure." Date: Aug. 2006.

* cited by examiner

MODULAR LED UNIT INCORPORATING INTERCONNECTED HEAT SINKS CONFIGURED TO MOUNT AND HOLD ADJACENT LED MODULES

RELATED APPLICATION

This application is a continuation-in-part of patent application Ser. No. 11/541,905, filed Sep. 30, 2006, currently pending. The contents of the parent application are incorporated herein by reference.

FIELD OF THE INVENTION

This invention relates to lighting fixtures and, more particularly, to the use of LED arrays (modules) for various lighting fixtures and applications, particularly lighting application for which HID lamps or other common light sources have most typically been used.

BACKGROUND OF THE INVENTION

In recent years, the use of light-emitting diodes (LEDs) for various common lighting purposes has increased, and this trend has accelerated as advances have been made in LEDs and in LED arrays, often referred to as "LED modules." Indeed, lighting applications which previously had been served by fixtures using what are known as high-intensity discharge (HID) lamps are now beginning to be served by fixtures using LED-array-bearing modules. Such lighting applications include, among a good many others, roadway lighting, factory lighting, parking lot lighting, and commercial building lighting.

Work continues in the field of LED module development, and also in the field of using LED modules for various lighting applications. It is the latter field to which this invention relates.

Using LED modules as sources of light in place of HID lamps or other common light sources is far from a matter of mere replacement. Nearly everything about the technology is different and significant problems are encountered in the development of lighting fixture and systems utilizing LED modules. Among the many challenging considerations is the matter of dealing with heat dissipation, to name one example.

Furthermore, use of LED modules for common lighting applications requires much more than the typical lighting development efforts required in the past with HID or other more common light sources. In particular, creating LED-module-base lighting fixtures for widely varying common lighting applications—such as applications involving different light-intensity requirements, size requirements and placement requirements—is a difficult matter. In general, harnessing LED module technology for varying common lighting purposes is costly because of difficulty in adapting to specific requirements. There are significant barriers and problems in product development.

There is a significant need in the lighting-fixture industry for modular LED units—i.e., units that use LED modules and that are readily adaptable for multiple and varied common lighting applications, involving among other things varying fixture sizes, shapes and orientations and varied light intensity requirements. There is a significant need for modular LED units that are not only easy to adapt for varying common lighting uses, but easy to assemble with the remainder of lighting fixture structures, and relatively inexpensive to manufacture.

OBJECTS OF THE INVENTION

It is an object of the invention to provide an improved modular LED unit that overcoming some of the problems and shortcomings of the prior art, including those referred to above.

Another object of the invention is to provide an improved modular LED unit that is readily adaptable for a wide variety of common lighting uses, including many that have predominantly been served in the past by HID lamps or other common light sources.

Another object of the invention is to provide an improved modular LED unit that significantly reduces product development costs for widely varying lighting fixtures that utilize LED0-array technology.

Another object of the invention is to provide an improved modular LED unit that facilitates manufacture and assembly of lighting fixtures using LED modules as light source.

How these and other objects are accomplished will become apparent from the following descriptions and the drawings.

SUMMARY OF THE INVENTION

The present invention is a modular LED unit including one or more LED modules each bearing an array of LEDs and secured with respect to a heat sink, such modular LED unit be adaptable for use in a variety of types of lighting fixtures.

More specifically, the inventive modular LED unit includes a number of LED modules separately mounted on individual interconnected heat sinks, with each heat sink having: a base with a back surface, an opposite surface, two base-ends and first and second sides; a plurality of inner-fins projecting from the opposite surface of the base; and first and second side-fins projecting from the opposite surface of the base and terminating at distal fin-edges, the first side-fin including a flange hook positioned to engage the distal fin-edge of the second side-fin of an adjacent heat sink. In some embodiments of this invention, each heat sink may also include first and second lateral supports projecting from the back surface, each of the lateral supports having an inner portion and an outer portion. The inner portions of such first and second lateral supports may have first and second opposed ledges, respectively, which form a passageway slidably supporting one of the LED modules against the back surface of the base.

In certain preferred embodiments, each heat sink includes a lateral recess at the first side of the base and a lateral protrusion at the second side of the base. Such recesses and protrusions of the heat sinks are positioned and configured for mating engagement of the protrusion of one heat sink with the recess of the adjacent heat sink. The recess is preferably in the outer portion of the first support and the protrusion is preferably on the outer portion of the second support.

Preferably, the first and second lateral supports of each heat sink are preferably in substantial planar alignment with the first and second side-fins, respectively. This allows a wide back surface to accommodate substantial surface-to-surface heat-exchange engagement between the LED module against such back surface of the heat sink.

In preferred embodiments, the flange hook of the first side-fin is preferably at the distal fin-edge of the first side-fin, where it is engaged by the distal fin-edge of the second side-fin of an adjacent heat sink. This provides particularly stable engagement of two adjacent heat sinks.

In preferred embodiments of this invention, the first and second side-fins are each a continuous wall extending along the first and second sides of the base, respectively. It is also preferred that the inner-fins be continuous walls extending along the base. The inner-fins are preferably substantially parallel to the side-fins. All fins are preferably substantially parallel to one another.

In certain highly preferred embodiments of this invention, at least one inner-fin is a "middle-fin" having a fin-end that forms a mounting-hole for securing the modular LED unit to another object, such as adjacent portions of a lighting fixture. The mounting-hole is preferably a coupler-receiving channel. The mounting hole which is the coupler-receiving channel is configured to receive a coupler, such as a coupler in the form of a screw or any similar fastener. In some of such preferred embodiments, each heat sink preferably includes two of the middle-fins.

It is further preferred that each middle-fin be a continuous wall that extends along the base between fin-ends, and that the coupler-receiving channel likewise extend continuously between the fin-ends. Such structures, like the rest of the structure of the preferred heat sink, is in a shape allowing manufacture of heat sinks by extrusion, such as extrusion of aluminum.

In some highly preferred embodiments of this invention, the modular LED unit includes a plurality of LED modules mounted on corresponding individual heat sinks, each heat sink including a base having a heat-dissipation base surface and a module-engaging base surface with one of the LED modules against the module-engaging base surface, and first and second side-fins each projecting along one of two opposite sides of the base and each terminating at a distal fin-edge.

Certain of such modular LED units include a spacer member adjacent to and interconnected with at least one of the heat sinks by at least one connection device holding the spacer member and the adjacent heat sink in side-by-side relationship. The spacer member has a spacer base with first and second spacer-base sides, and at least one spacer side-fin along one spacer-base side. In some situations, the spacer member is between and connected to a pair of the heat sinks of an LED modular unit, maintaining such heat sinks in spaced relationship to one another. In other situations, the spacer member may be connected to only one heat sink, putting the spacer member at the end of the modular LED unit.

Such spacer members and selected spacer member placement provide a great deal of flexibility in lighting-fixture configuration, allowing use of LED modules of a previously-chosen "standard" size for fixtures of widely varying dimensions and light-output requirements. For example, a fixture of a particular desired dimension and light requirement can use a certain number of LED modules, with one or more spacer members accommodating unused space an/or spreading the LED modules to temper the intensity of light output. Spacer members may themselves have "standard" sizes and shapes to accommodate a wide variety of LED lighting-fixture configurations and sizes.

In modular LED units of the highly preferred embodiments just described, the first and second side-fins of each heat sink are a male side-fin and a female side-fin, respectively and the spacer side-fin is a male side-fin extending along the first spacer-base side and terminating at a distal spacer fin-edge. The connection device includes a flange hook on the female side-fins to engage the distal fin-edge of the adjacent male side-fin of the adjacent heat sink or spacer member. The spacer member preferably includes an end-part extending from the spacer base at one end thereof and a projection extending from the end-part along at least a portion of the second spacer-base side and spaced from the second spacer-base side. The connection device further includes a spring-clip holding the projection of the spacer member against the adjacent male side-fin. The projection may take various forms facilitating interconnection of the spacer member with the adjacent heat sink; for example, the projection may be a tab extending above the second spacer-base side and parallel to the spacer side-fin.

DETAILED DESCRIPTION OF PREFERRED EMBODIMENTS

Figure 1:
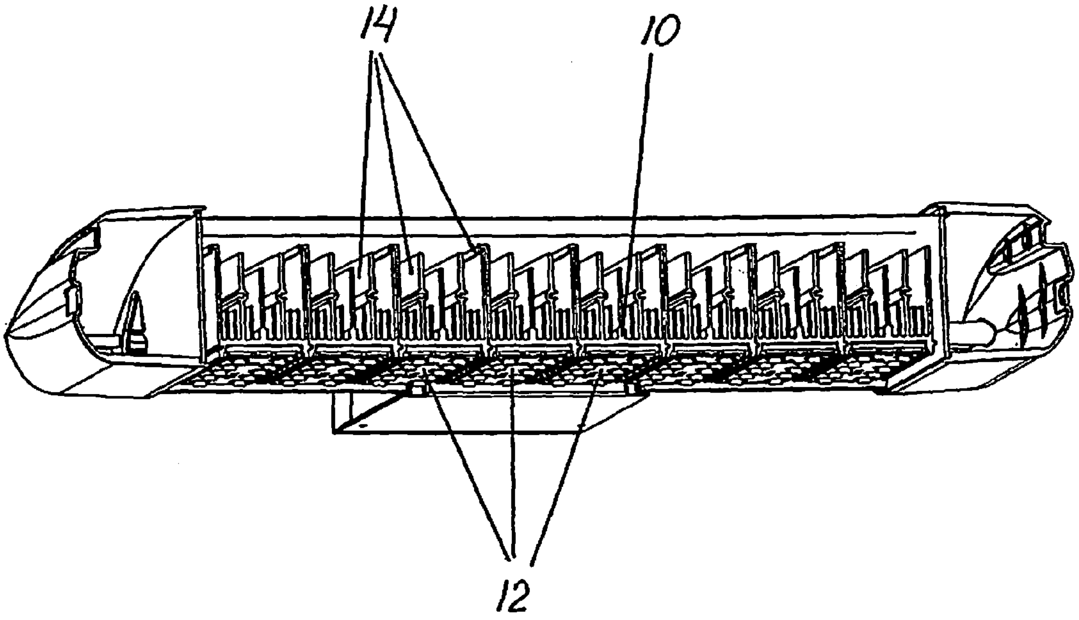
FIG. 1 is a fragmentary perspective view of an LED floodlight fixture including a modular LED unit in accordance with this invention.
Figure 2:
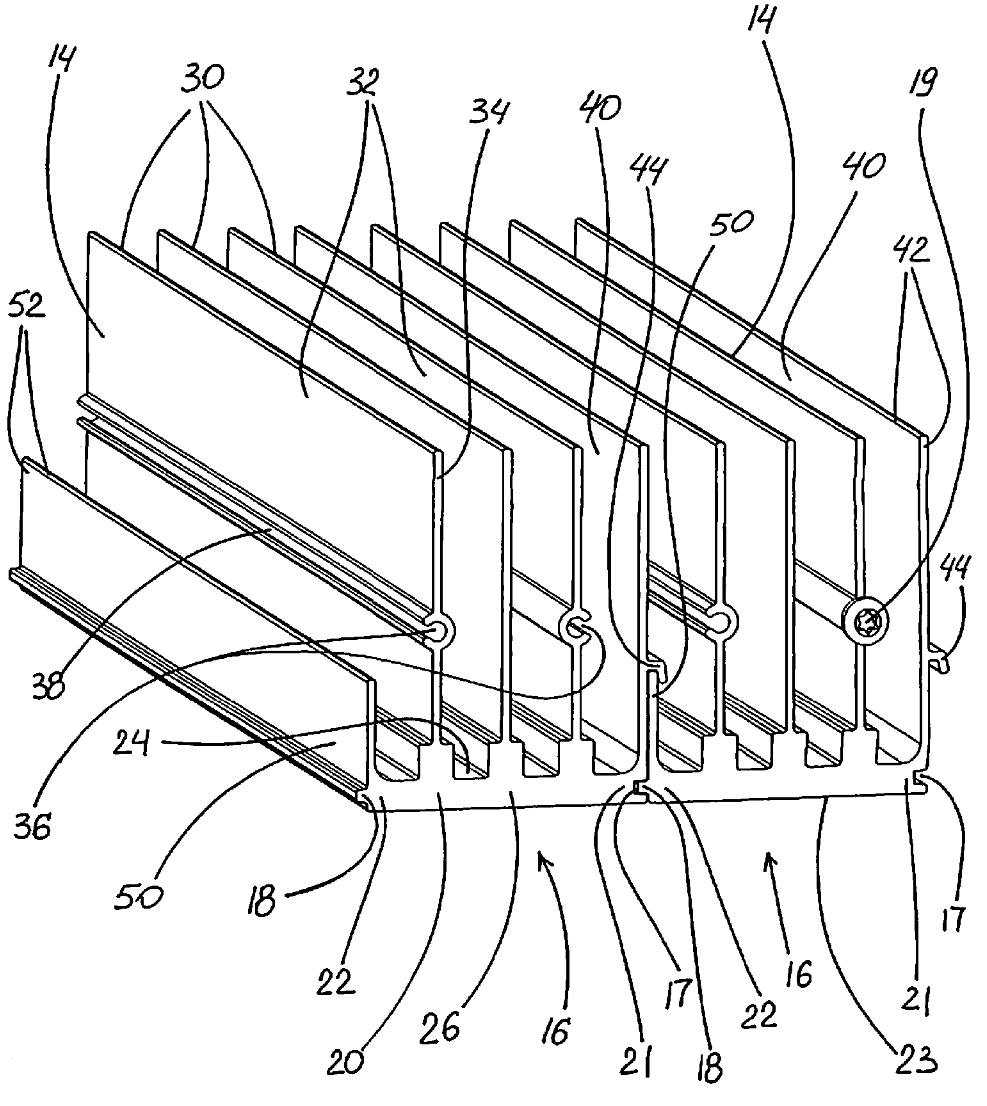
FIG. 2 is an enlarged fragmentary end-wise perspective view of two interconnected heat sinks of the modular LED unit of FIG. 1.
Figure 3:
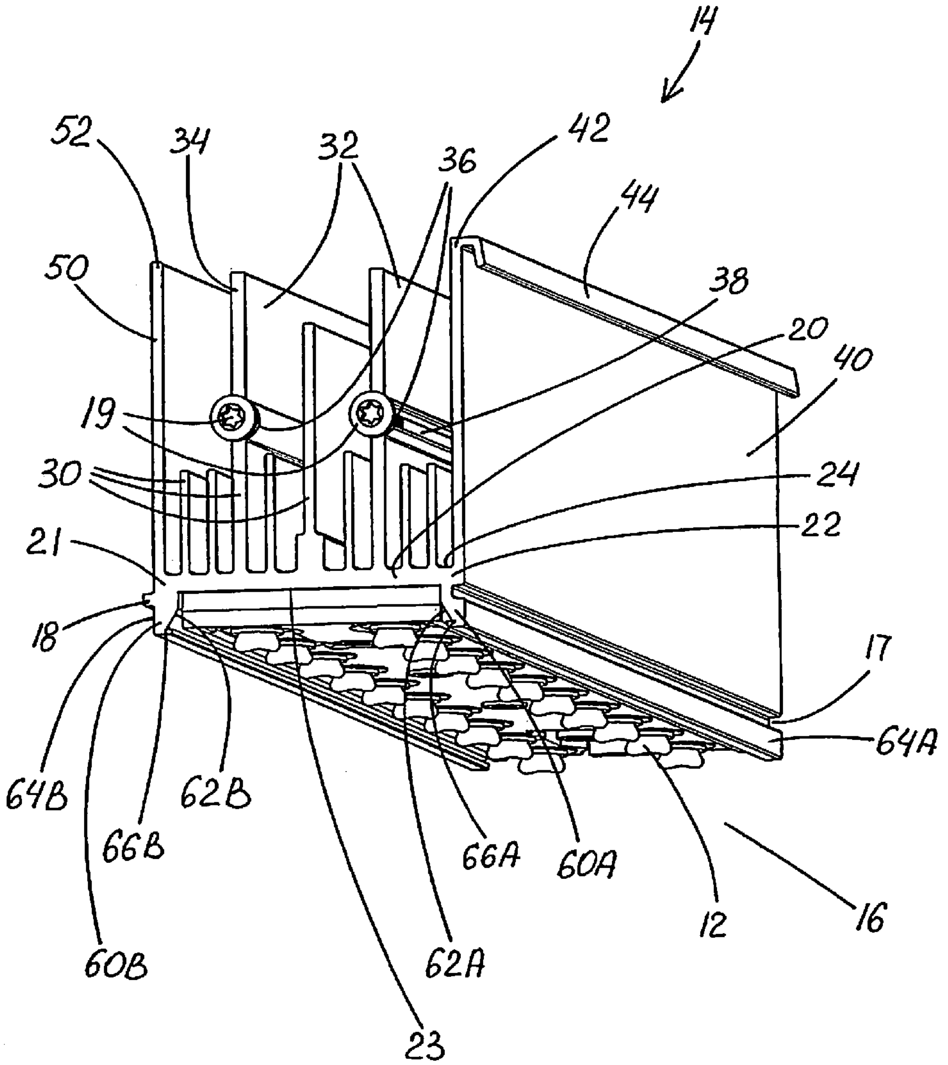
FIG. 3 is an enlarged fragmentary perspective view of one heat sink and its associated LED module mounted thereon.

FIGS. 1-3 illustrate a preferred modular LED unit 10 in accordance with this invention. Modular LED unit 10 has a number of LED modules 12 separately mounted on individual interconnected heat sinks 14. Each heat sink 14 separately supports one LED module 12.

Each heat sink 14 has a base 20 with a flat back surface 23, an opposite surface 24, two base-ends 26, a first side 21 and a second side 22. Heat sink 14 also includes a plurality of inner-fins 30 projecting from opposite surface 24 of base 20, a first side-fin 40 and a second side-fin 50, each of the side-fins also projecting from opposite surface 24. First and second side-fins terminate at distal fin-edges 42 and 52, respectively. First side-fin 40 includes a flange hook 44 at distal fin-edge 42. Flange hook 44 is positioned to engage distal fin-edge 52 of second side-fin 50 of an adjacent heat sink 14.

Each heat sink 14 also includes a first lateral support 60A and a second lateral support 60B projecting from back surface 23 of base 20. First and second lateral supports 60A and 60B are in substantial planar alignment with first and second side-fins 40 and 50, respectively. Lateral supports 60A and 60B have inner portions 62A and 62B, respectively, and outer portions 64A and 64B, respectively. Inner portions 62A and 62B of first and second lateral supports 60A and 60B have first and second opposed ledges 66A and 66B, respectively, which form a passageway 16 that slidably supports one of LED modules 12 against back surface 23 of base 20, holding module 12 in firm surface-to-surface heat-transfer relationship therewith.

As further illustrated in FIGS. 2 and 3, each heat sink 14 includes a lateral recess 17 at a first side 21 of base 20 and a lateral protrusion 18 at a second side 22 of base 20. As best shown in FIG. 2, recesses 17 and protrusions 18 are positioned and configured for mating engagement of protrusion 18 of one heat sink with recess 17 of the adjacent heat sink. Recess 17 is in outer portion 64A of first support 60A and protrusion 18 is on outer portion 64B of second support 60B.

As shown in the drawings, first and second side-fins 40 and 50 are continuous walls extending along first and second sides 21 and 22, respectively, of base 20. Inner-fins 30 are also continuous walls extending along base 20. All of such fins are substantially parallel to one another.

As seen in the drawings, in each heat sink 14, two of the inner-fins are adapted to serve a special coupling purpose—i.e., for coupling to other structures of a lighting fixture. These "middle-fins," identified by numerals 32, have coupler-receiving channels 38 running the length thereof—from fin-end 34 at one end of each middle-fin 32 to fin-end 32 at the opposite end thereof. Channels 38 form mounting-holes 36 which are used to secure modular LED unit 10 to another object, such as a frame member of a lighting fixture. Couplers may be in the form of screws 19, as shown in FIGS. 2 and 3.

As already noted, heat sinks 14 are preferably metal (preferably aluminum) extrusions. The form and features of heat sinks 14 allow them to be manufactured in such economical method, while still providing great adaptability for lighting purposes.

The characteristics of heat sinks 14 of the modular LED units of this invention facilitate their ganging and use in various ways, and facilitate connection of modular LED units of various sizes and arrays in a wide variety of lighting fixtures.

Figure 4:
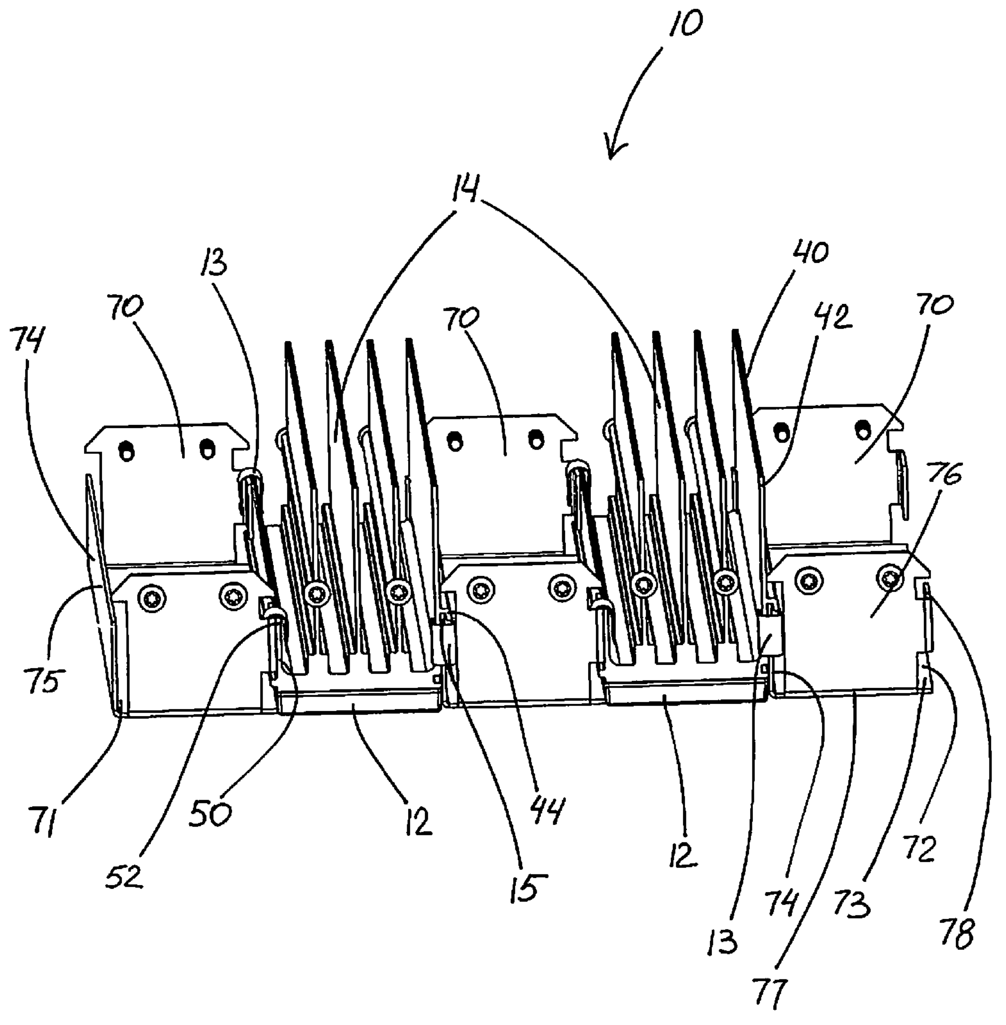
FIG. 4 is an enlarged fragmentary end-wise perspective view of the modular LED unit including the spacer member between a pair of the heat sinks.
Figure 5:
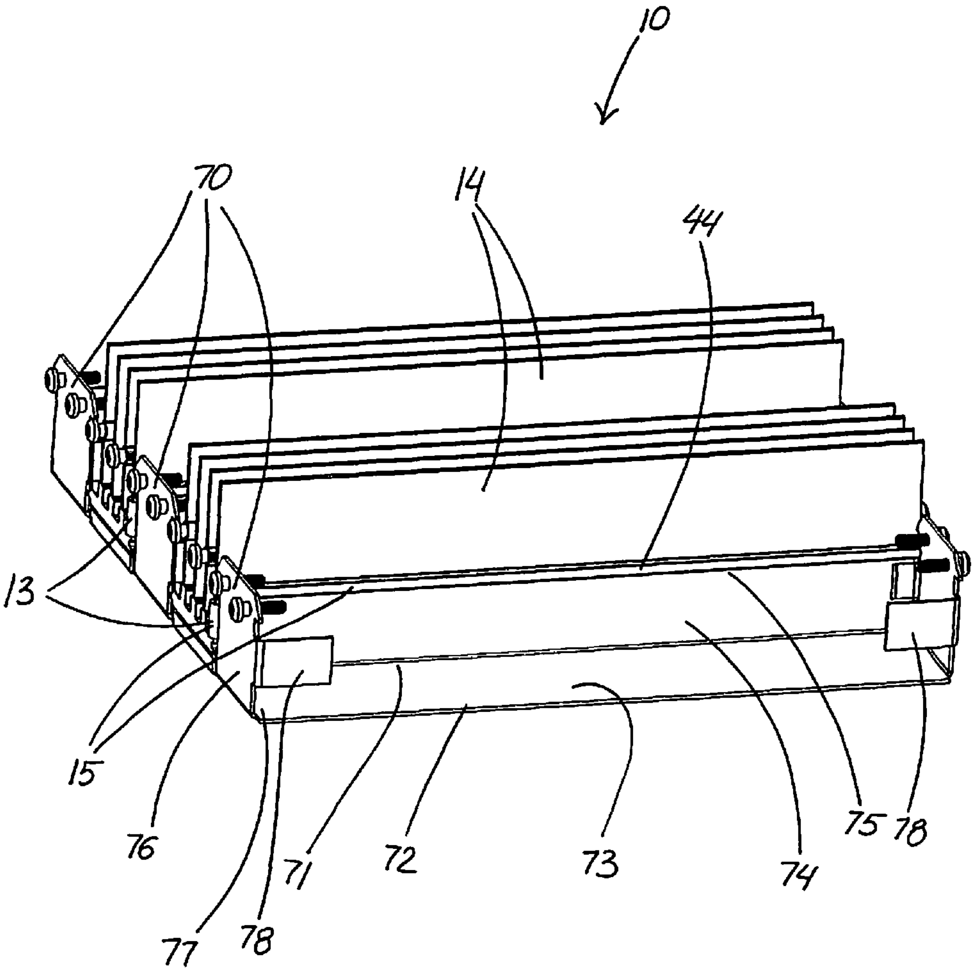
FIG. 5 is an enlarged fragmentary side perspective view of the modular LED unit of FIG. 4.
Figure 6:
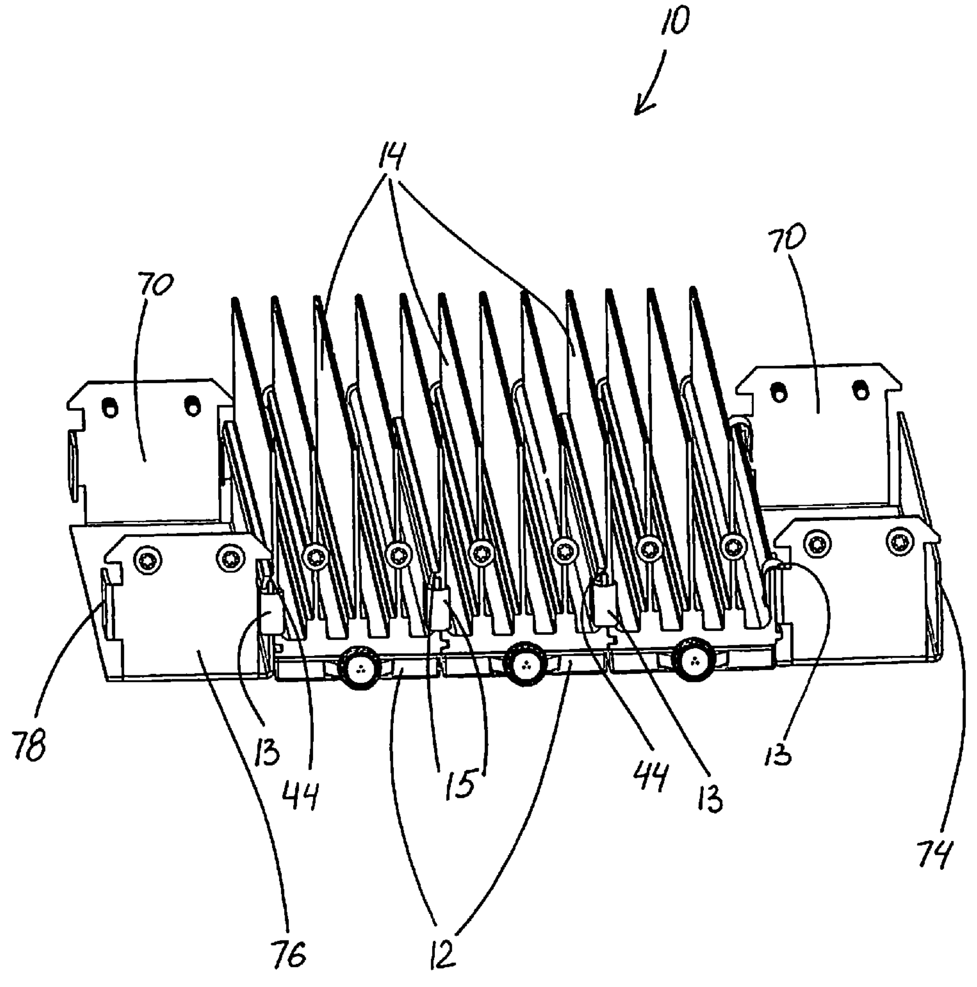
FIG. 6 is an enlarged fragmentary end-wise perspective view of the modular LED unit including the spacer member connected to one heat sink.

FIGS. 4-6 illustrate highly preferred embodiments of modular LED unit 10, illustrating varying uses of a spacer member 70. Spacer member 70 has a spacer base 73 with a first spacer-base side 71 and a second spacer-base side 72, and a spacer side-fin 74 along spacer-base side 71. Spacer side-fin 74 terminates at a distal spacer fin-edge 75. Spacer member 70 also includes an end-part 76 extending from spacer base 73 at each end 77 of spacer base 73, and a projection 78 extends from each of end-parts 76 along a portion of second spacer-base side 72 at a position spaced from second spacer-base side 72. In each embodiment illustrated, a connection device 15 holds spacer member 70 and an adjacent heat sink 14 in side-by-side relationship.

FIGS. 4 and 5 show an arrangement in which spacer member 70 is positioned between and connected to a pair of heat sinks 14, maintaining such heat sinks in spaced relationship to one another. One of heat sinks is connected to spacer member 70 by the engagement of flange hook 44 over distal spacer fin-edge 75, in a female-male relationship. The other heat sink is connected to spacer member 70 by a pair of spring-clips 13, each of which holds one of projections 78 against adjacent male side-fin 50.

FIG. 6 shows another arrangement in which two spacer members 70 are each positioned at a respective end of a modular LED unit. One of the spacer members is attached to its adjacent heat sink by the flange hook/spacer fin-edge engagement described above, and the other spacer member is attached to its adjacent heat sink by spring-clips 13.

As shown in FIG. 6, additional spring-clips 13 help secure adjacent heat sinks together by their placement about adjacent side-fins 50 and 40.

While the principles of the invention have been shown and described in connection with specific embodiments, it is to be understood that such embodiments are by way of example and are not limiting.

The invention claimed is:

1. A modular LED unit comprising at least one LED module each module bearing an array of LEDs and being mounted on a separate corresponding one of a plurality of individual interconnected heat sinks, each heat sink having:

- a base with a module-engaging surface, a heat-dissipation surface, two base-ends and two opposite sides, each LED module being against the module-engaging surface of a corresponding heat-sink; and
- a female side-fin and a male side-fin, one along each of the opposite sides and each projecting from the heat-dissipation surface and terminating at a distal fin-edge, the female side-fin including a flange hook positioned to engage the distal fin-edge of the male side-fin of an adjacent heat sink to hold each adjacent pair of heat sinks in side-by-side relationship to one another.

2. The modular LED unit of claim 1 wherein each heat sink further includes a lateral recess and a lateral protrusion, one at each of the opposite sides of the base, the recess and the protrusion being positioned and configured for mating engagement of the protrusion of one heat sink with the recess of the adjacent heat sink when the heat sinks are in proper alignment.

3. The modular LED unit of claim 1 wherein, for each heat sink, each side-fin is a continuous wall extending along one of the opposite sides of the base.

4. The modular LED unit of claim 3 wherein, each heat sink further has at least one inner-fin projecting from the heat-dissipation base surface between the side-fins, at least one of the fins has a fin-end forming a mounting-hole for securing the modular LED unit to another object, the mounting-hole being a coupler-receiving channel.

5. The modular LED unit of claim 1 wherein the heat sinks are metal extrusions.

6. A modular LED unit comprising at least one LED module bearing an array of LEDs and each module being mounted on a separate corresponding one of individual interconnected heat sinks, each heat sink having:

- a module-engaging surface and a heat-dissipation surface, each LED module being against the module-engaging surface of a separate corresponding heat-sink;
- at least one fin projecting from the heat-dissipating surface; and
- each pair of adjacent heat sinks has at least one connection device interconnecting and holding such pair of heat sinks in side-by-side relationship to one another.

7. The modular LED unit of claim 6 wherein:

- the heat sink further has two opposite sides;
- the at least one fin of each heat sink includes first and second side-fins, one along each of two opposite sides of the base and each terminating at a distal fin-edge; and
- the connection device engages the first side-fin of one heat sink of such pair with the second side-fin of the other heat sink of such pair.

8. The modular LED unit of claim 7 wherein the connection device is mating integral portions of the adjacent pair of heat sinks.

9. A modular LED unit comprising:

- a plurality of LED modules each bearing an array of LEDs and each being mounted on separate corresponding individual heat sinks, each heat sink including a heat-dissipation surface and a module-engaging surface with one of the LED modules against the module-engaging surface;
- a spacer member adjacent to and interconnected with at least one of the heat sinks; and
- at least one connection device holding the spacer member and the adjacent heat sink in side-by-side relationship.

10. The modular LED unit of claim 9 wherein:

each heat sink includes:

- a base having the heat-dissipation surface and the module-engaging surface; and
- a female and male side-fins, each along one of two opposite sides of the base and each terminating at a distal fin-edge;

the spacer member has a spacer base with first and second spacer-base sides and at least one spacer side-fin along one spacer-base side, the spacer side-fin is a male spacer side-fin extending along the first spacer-base side and terminating at a distal spacer fin-edge; and the connection device includes a flange hook on the heat-sink female side-fin to engage the distal fin-edge of the adjacent male side-fin.

11. The modular LED unit of claim 9 wherein the spacer member is between and connected to a pair of the heat sinks, maintaining such heat sinks in spaced relationship to one another.

12. The modular LED unit of claim 11 wherein:

the spacer member further includes an end-part extending from the spacer base at one end thereof and a projection extending from the end-part along at least a portion of the second spacer-base side and spaced therefrom; and the connection device includes a spring-clip holding the projection of the spacer member against the adjacent male side-fin.

* * * * *

UNITED STATES PATENT AND TRADEMARK OFFICE

CERTIFICATE OF CORRECTION

PATENT NO. : 7,952,262 B2
APPLICATION NO. : 11/860843
DATED : May 31, 2011
INVENTOR(S) : Wilcox et al.

It is certified that error appears in the above-identified patent and that said Letters Patent is hereby corrected as shown below:

In column 2, line 15, delete “LED0-array” and replace with --LED-array--.

In column 5, line 8, delete “32” and replace with --34--.

Signed and Sealed this
Sixth Day of September, 2011

David J. Kappos
*Director of the United States Patent and Trademark Office*